United States Patent [19]
Seo et al.

[11] Patent Number: 5,579,268
[45] Date of Patent: Nov. 26, 1996

[54] SEMICONDUCTOR MEMORY DEVICE CAPABLE OF DRIVING WORD LINES AT HIGH SPEED

[75] Inventors: Dong-Il Seo, Kyungki-do; Tae-Seong Jang, Boosan, both of Rep. of Korea

[73] Assignee: Samsung Electronics Co., Ltd., Suwon, Rep. of Korea

[21] Appl. No.: 580,885

[22] Filed: Dec. 29, 1995

Related U.S. Application Data

[60] Division of Ser. No. 280,849, Jul. 26, 1994, which is a continuation-in-part of Ser. No. 224,480, Apr. 6, 1994, abandoned.

[30] Foreign Application Priority Data

Apr. 6, 1993 [KR]  Rep. of Korea ................... 5723/1993

[51] Int. Cl.$^6$ ................................... G11C 11/40
[52] U.S. Cl. ................... 365/200; 365/194; 365/230.01; 365/230.06; 365/189.09; 365/189.11
[58] Field of Search ................... 365/200, 194, 365/230.01, 230.06, 189.09, 189.11, 189.01

[56] References Cited

U.S. PATENT DOCUMENTS

| | | | |
|---|---|---|---|
| 5,168,468 | 12/1992 | Magome et al. | 365/200 |
| 5,276,360 | 1/1994 | Fujime | 365/230.06 |
| 5,311,472 | 5/1994 | Ota | 365/200 |
| 5,327,381 | 7/1994 | Johnson et al. | 365/200 |
| 5,422,850 | 6/1995 | Sukegawa et al. | 365/200 |

FOREIGN PATENT DOCUMENTS 4-349298  12/1992  Japan.

*Primary Examiner*—Viet Q. Nguyen
*Attorney, Agent, or Firm*—Cushman Darby & Cushman, L.L.P.

[57] ABSTRACT

A semiconductor memory device for driving word lines at high speed has a word line signal generating circuit for receiving a predecoded signal of a row address, and power source supply circuit for supplying the output signal of the word line signal generating circuit to a word line as source power. The device includes a normal word line decoder for receiving the predecoded signal and the output signal of the power source supplying circuit, respectively and for selecting a normal word line; a spare word line decoder for receiving the predecoded signal and the output signal of the power source supply circuit, respectively and for selecting a spare word line; and a redundancy enabling circuit connected to the spare word line decoder and the normal word line decoder for determining whether the normal word line is selected.

1 Claim, 6 Drawing Sheets

SEMICONDUCTOR MEMORY DEVICE CAPABLE OF DRIVING WORD LINES AT HIGH SPEED

This is a division application of U.S. application No. 08/280,849 filed Jul. 26, 1994, which is a continuation-in-part application of U.S. application No. 08/224,480 filed Apr. 6, 1994, abandoned.

This application has priority rights based on Korean Application No. 5723/1993 filed Apr. 6, 1993, which Korean Application is hereby incorporated by reference.

FIELD OF THE INVENTION

It is generally known that a system having a semiconductor memory device as a memory element operates at high speed by utilizing a frequency divider. However, semiconductor memory devices are limited in their ability to increase data access speed due to increases in RC loading (where R and C represent specific resistance and capacitance, respectively) of the semiconductor memory device under a submicron design rule. The "data access speed" stated above refers to the speed at which data is read and written from/to a memory cell. The data access speed depends largely upon the driving speed of a word line connected to a gate transistor of the memory cell.

FIG. 1 is a block diagram showing elements used in a conventional method of driving a word line. In the configuration shown, if a row address strobe (RAS) supplied externally from the chip changes to an active "low" level, the chip is advanced to an active cycle. Then a row address input buffer 50A (or "RAI") is enabled and, upon receipt of address information, a decoded address signal output from the row address input buffer 50A is input to a predecoder 50B. Thereafter, the output signal of the predecoder 50B is input to each of a first control signal øXE generation circuit 50C, a normal word line decoder 50F, and a spare word line decoder 50H as address information. Furthermore, a signal output from the øXE generation circuit 50C is received by a second control signal øXEX generation circuit 50D, a row redundancy enable signal øRRE generation circuit 50G, and the spare word line decoder 50H. A signal output from the øXEX generation circuit is then received by a third control signal øX generation circuit 50E, and the signal output from the øX generation circuit 50E then functions as a power source for the normal word line decoder 50F and the spare word line decoder 50H.

FIG. 2 is an operation timing chart of FIG. 1.

The spare word line decoder 50H, the øRRE generation circuit 50G and the normal word line decoder 50F may be constructed as shown in FIG. 3A, FIG. 3B and FIG. 3C, respectively.

The signal output from the row address input buffer 50A is generated as a function of the signal received from the row address strobe $\overline{RAS}$, the output of the øXE generation circuit 50C is synchronously generated as a function of the signal received from the output of the RAI buffer 50A, the output of the øXEX generation circuit 50D is generated as a function of the signal received from the øXE generation circuit 50C, and the output of the øX generation circuit 50E is generated as a function of the signal received from the øXEX generation circuit 50C, respectively.

Referring to FIG. 3A illustrating the spare word line decoder 50H of FIG. 1 during a precharge cycle, a node A and a node B are precharged to a logic "high" state in response to a row decoder precharge signal øDPX of a logic "low" state. Then, if normal word line address information is input, the node A changes to a logic "low" state. In the case where node A has the logic "low" state, and transistors 1 and 2 are turned off, a driver stage indicated by a dotted line maintains a disable state. In the meanwhile, however, if address information for accessing a defective normal word line is input, node A (or "RED" which represents a "redundancy enable driving" node) stays at the logic "high" state. After awhile, if the signal øXE changes to the logic "high" state, transistors 3 and 4 are both turned on. As a result, the node B goes to the "low state. Accordingly, a self-boosting node is precharged to a voltage Vcc-Vt (where Vt represents a threshold voltage of a transistor 6), and the signal øX is output to an output terminal OUT.

In the øRRE generation circuit 50G of FIG. 3B, if a redundancy enabling driving signal RED goes to the "low" state before the signal øXE changes to the "high" state, a normal word line selection transistor 12 is turned off. Then, the signal øRRE remains in the "low" state through an inverter 15. Meanwhile, if the signal RED maintains the "high" state until the signal øXE changes to the "high" state (at this time, the spare word line is selected), transistors 12 and 13 are turned on and the signal øRRE goes to the "high" state, thereby disabling the normal word line decoder 50F.

In the case of the normal word line decoder 50F of FIG. 3C, since the signal øRRE is applied to the gate of a transistor 21, if the signal øRRE becomes "low" the transistor 21 is turned off, and node C maintains at a precharge state. Next, if the signal øX is input, the level of that signal is output through a transistor 24. Meanwhile, if the signal øRRE becomes "high" node C goes "low" and the transistor 24 is turned off. In this instance, the input signal øX is not output to the output terminal OUT.

The reason that signal øXEX generation circuit 50D in FIG. 1 is required in the conventional method for driving a word line will now be explained with more particularity. Where the spare word line of a redundancy cell array is selected due to a defect in a normal memory cell, the input address for changing the logic state at node A as a precharge node of the spare word line in FIG. 3A is cut off upon receipt of the address signal of the defective memory. Here, if signal øXE is input, the node B changes to an enabling state, that is, to the "low" state by the conductive state of the transistors 1 and 2. If the node B becomes "low", the self-boosting node is precharged to a voltage Vcc-Vt. At this time, signal øXEX is required to input signal øX. If such an operation is not performed orderly as expected, a defect of the word line will occur due to the rapid decrease in the boosting rate, or the signal øXE level is not changed enough via a transistor 7. As a result, since the signal øXE cannot directly enable signal øX, it is necessary for the signal øXE to travel through the path from the signal øXE to the signal øXEX and then øX (namely, the precharge time of the self boosting is ensured).

The conventional method for driving a word line is, however, faced with the following problems. First, signal øXE is limited in its enabling time. That is, if signal øXE in FIG. 3A is input while the RED signal changes to the "low" state, transistors 3 and 4 are turned on and node B is in the "low" state. Then, when the signal øX is input, the output of the signal øX may erroneously be enabled. Thus, the signal øXE must be input after the transistor 3 is turned off by the RED signal. Further, in FIG. 3B, if the signal øXE is enabled in the course of changing the RED signal to the "low" state, a glitch phenomenon of signal øRRE may occur, and node C may thus change to the "low" level so that the selection of a normal word line is not made. Second, there is a problem in that the normal word line and the spare word line are selected at the same time. That is, in FIGS. 3B and 3C, when the glitch in signal øRRE makes it so that signal øRRE is incapable of turning on transistor 21, due to the narrow generating interval of the signals RED and øXE (in other words when the glitch level of the signal øRRE is smaller than that of Vt), the normal word line is enabled, and in this state, the RED signal overlaps with signal øXE. When the signal øXE is input, the signal øX level is output via the transistor 7. As a result, the undesirable phenomenon that the normal word line and the spare word line are enabled at the same time occurs.

SUMMARY OF THE INVENTION

It is therefore one object of the present invention to provide a semiconductor memory device capable of driving a word line at high speed.

It is another object of the present invention to provide a semiconductor memory device that prevents a normal word line and a spare word line from being enabled at the same time.

It is a further object of the present invention to provide a semiconductor memory device capable of easily adjusting the enabling time of a signal øX supplied to a word line power source.

It is another object of the present invention to provide a semiconductor memory device capable of preventing an undesired selection of a word line due to a glitch in a redundancy enabling signal.

It is a further object of the present invention to provide a semiconductor memory device capable of easily adjusting the enabling time of a signal øX supplied to a word line and, at the same time, of driving a word line at high speed.

To achieve these objects, the present invention is directed to a semiconductor memory device in which each normal word line and spare word line is driven only by a decoded signal of a row address.

According to the present invention, a semiconductor memory device includes a row address input buffer which is synchronous to an input of a row address strobe signal and initiates a sequence of operations which use interconnected circuits of the memory device. These include a predecoder that inputs the output signal from the row address input buffer and predecodes a row address therefrom. A word line signal generation circuit generates a word line signal from the output signal of the predecoder. A power supply source inputs the output signal of the word line signal generation circuit and supplies source power to a given word line. A normal word line decoder inputs respective output signals of the predecoder and the power supply source and selects a normal word line. A spare word line decoder inputs respective output signals of the predecoder and the power supply source and selects a spare word line when a row address corresponding to the spare row decoder address is detected.

The semiconductor memory device according to the preferred embodiment of the present invention advantageously omits a circuit for delaying the application time of a word line boosting signal. Specifically, a conventional øXEX generation circuit for generating a signal øX from an input of a row address after a predetermined delay time is made unnecessary. In addition, the øRRE generation circuit is driven only from the redundancy signal obtained from the spare word line decoder.

BRIEF DESCRIPTION OF THE DRAWINGS

These and other objects, features, and advantages of the present invention will be better understood in view of the following detailed description of the invention, taken in conjunction with the accompanying drawings. In the drawings, it should be noted that like elements are represented by like symbols or reference numerals, wherein.

DETAILED DESCRIPTION OF THE PREFERRED EMBODIMENTS

The term "word line signal generation circuit" used herein refers to a circuit for generating a word line boosting signal from a row address, the word line boosting signal being input to a typical word line power source for supplying source power to a word line.

Figure 1:
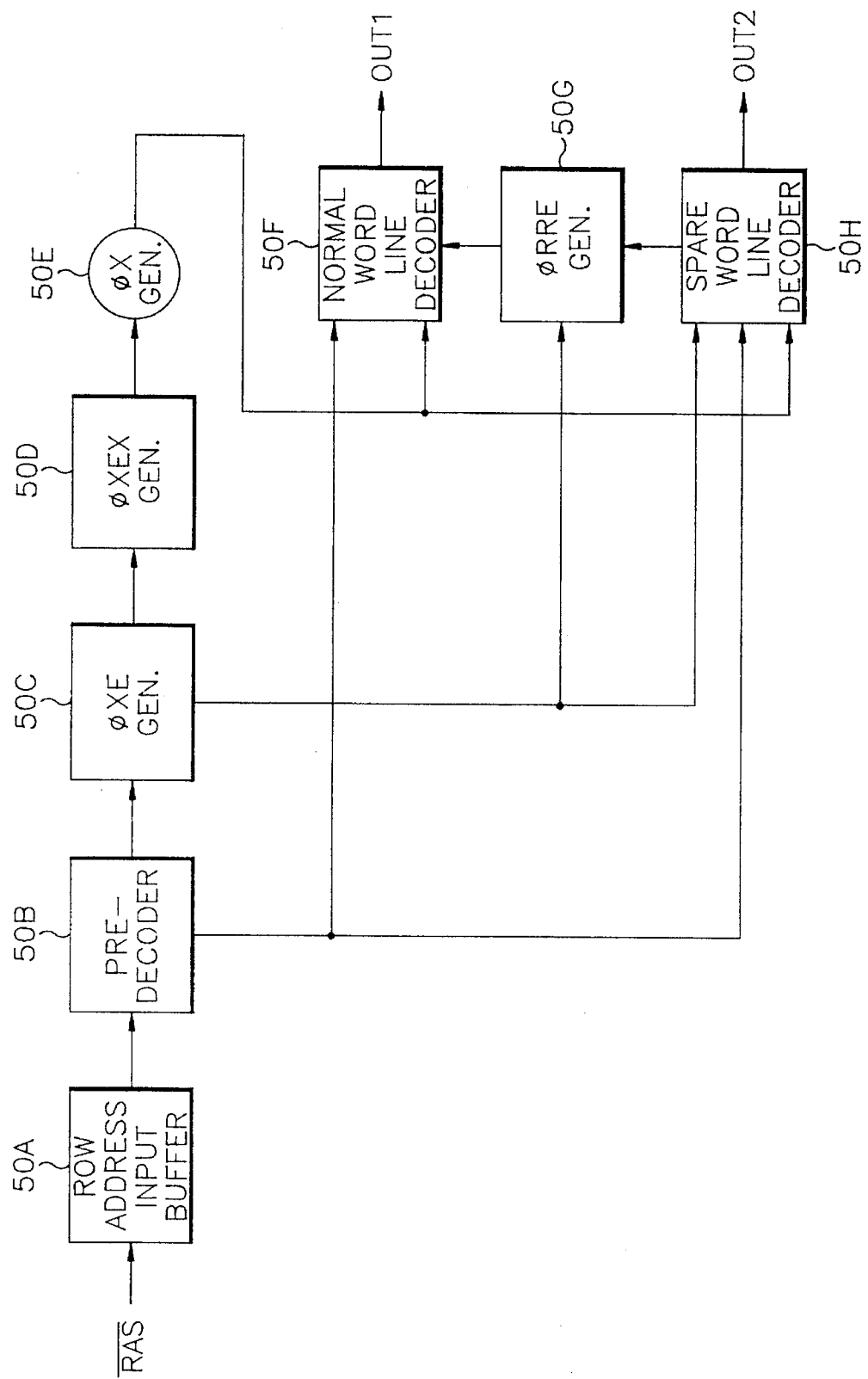
FIG. 1 is a block diagram showing elements used in a conventional method for driving a word line.
Figure 2:
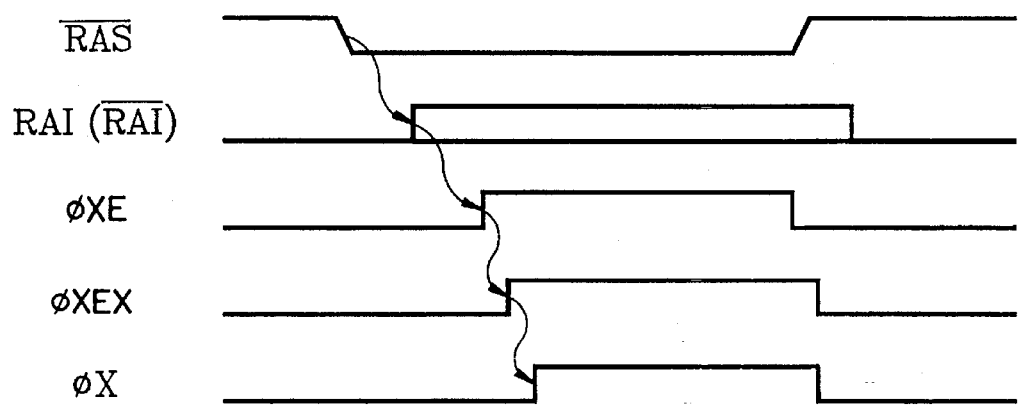
FIG. 2 is a timing chart for the word line driving method of FIG. 1.
Figure 3A:
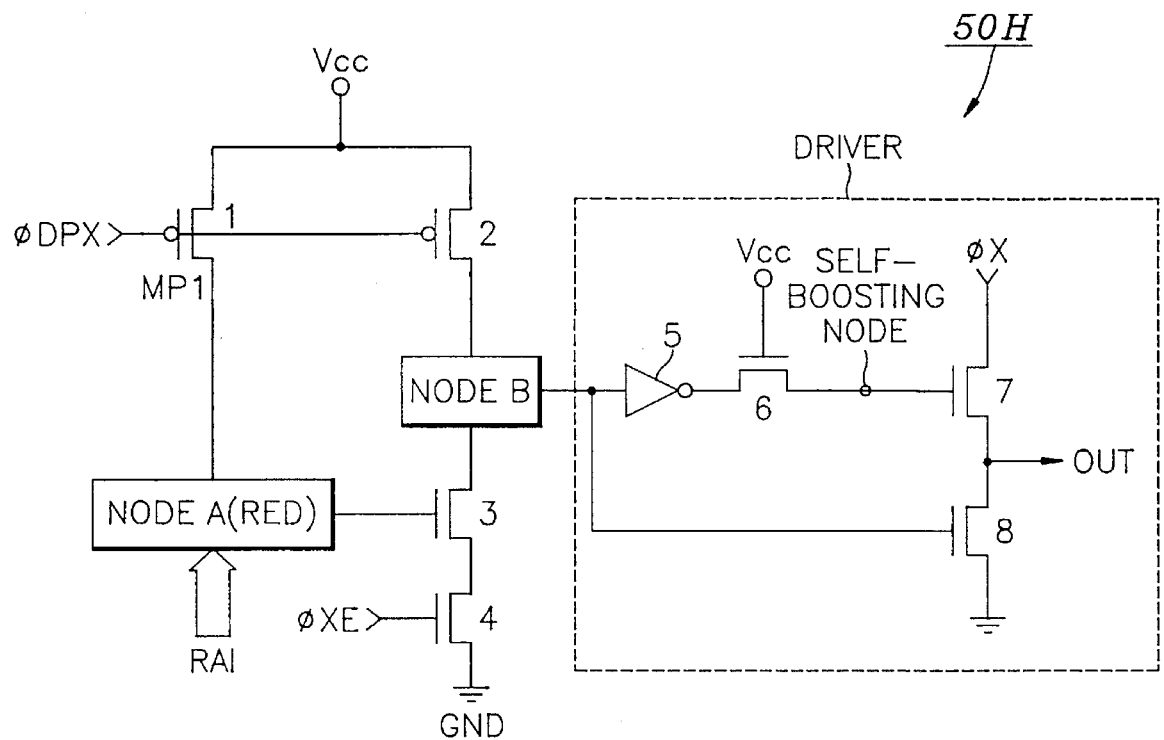
FIG. 3A is a detailed circuit diagram showing the spare word line decoder of FIG. 1.
Figure 3B:
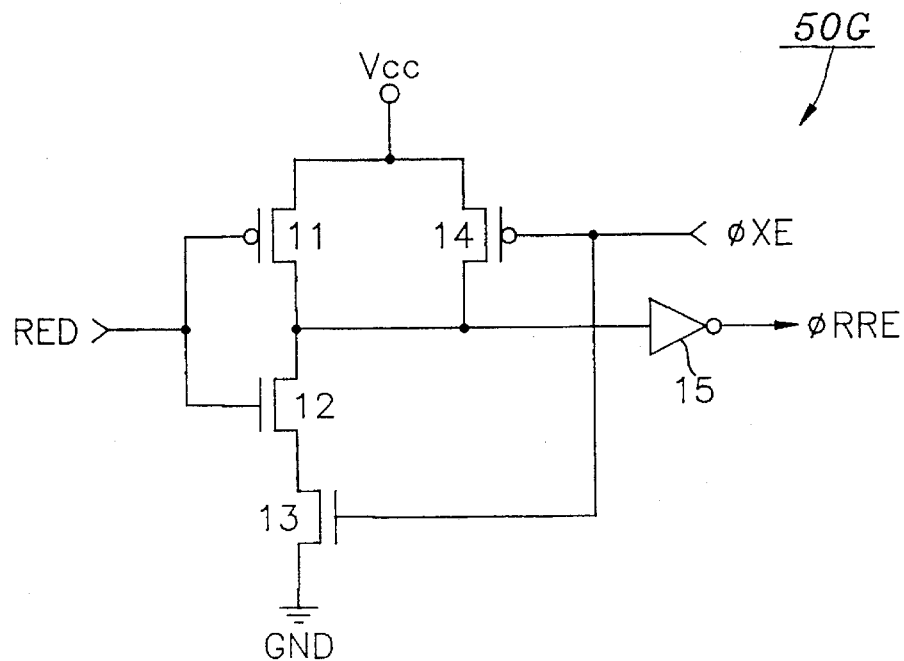
FIG. 3B is a detailed diagram showing the redundancy enabling circuit of FIG. 1.
Figure 3C:
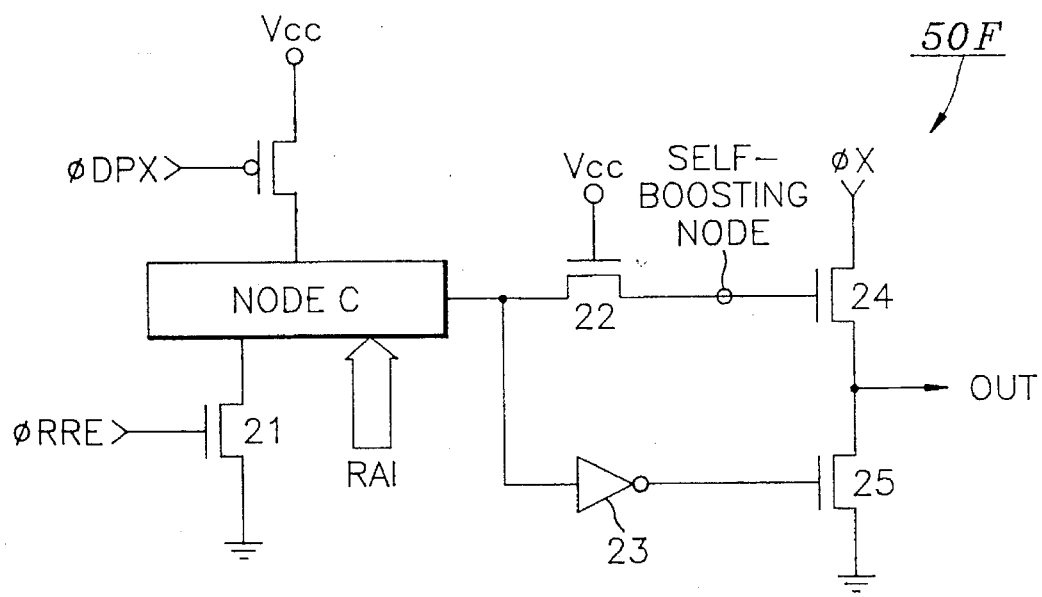
FIG. 3C is a detailed circuit diagram showing the normal word line decoder of FIG. 1.

In order to supply sufficient driving power to the word lines in the prior art circuit of FIG. 3A, it is generally required that signal øX be supplied to the transistor 7 during or after the self-boosting node changes fully to the "high" level. However, the transistor 4 is controlled by the signal. øXE, and thus, the logic level at the self-boosting node is determined with a specific time delay (through the elements 3, 4, 5 and 6). Therefore, signal øX must be sufficiently delayed. To accomplish this result, the signal øXE is delayed twice by 50D and 50E of FIG. 1 to obtain resultant signal øX in the order of øXE-øXEX-øX as shown in FIG. 2. If this sequence of obtaining the resultant signal øX is not ensured, the spare word line connected to the output voltage may not be driven properly due to insufficient driving power. The present invention eliminates the step of using the øXEX generation circuit to delay signal øXE in obtaining the sufficiently delayed signal øX.

Figure 4:
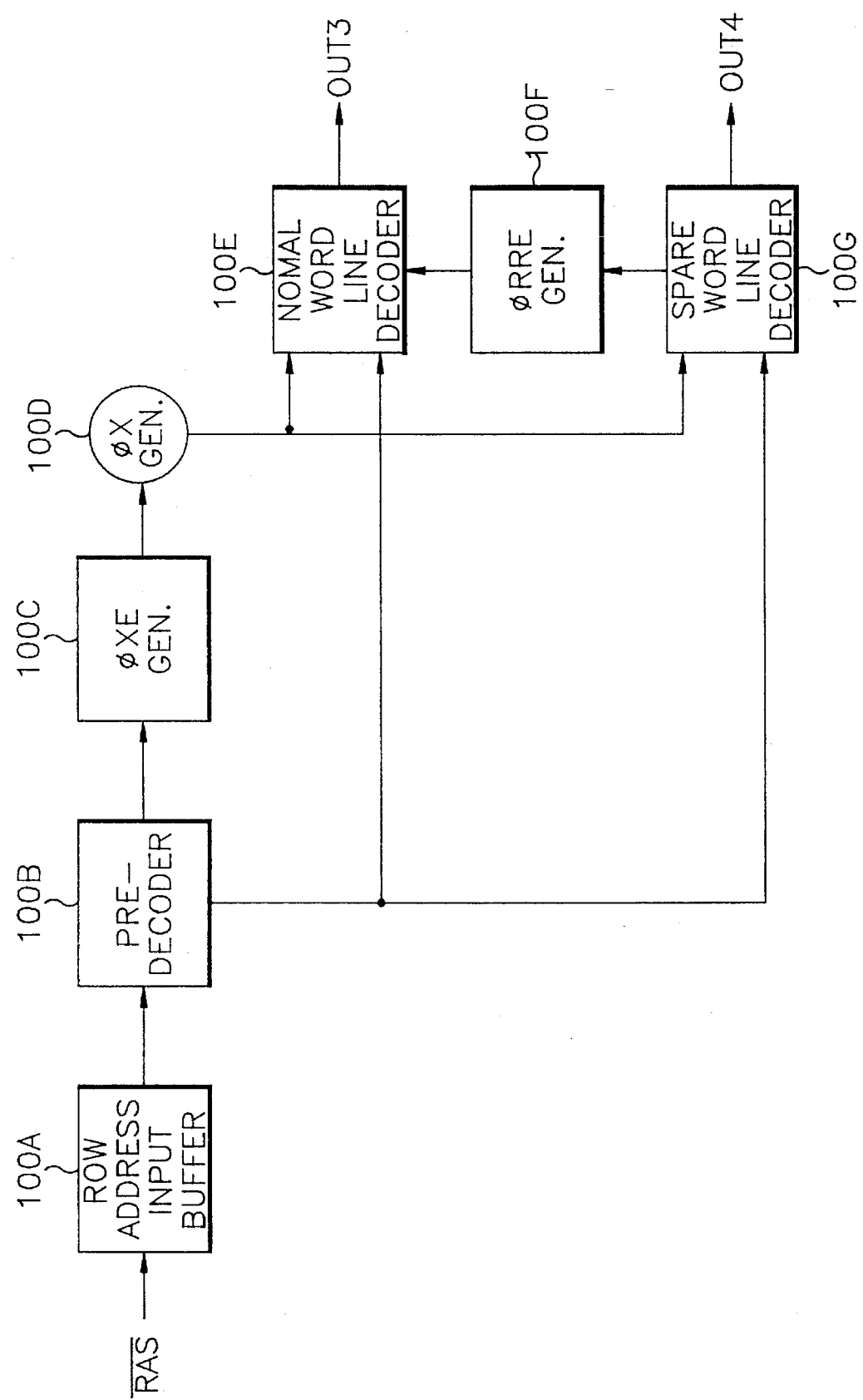
FIG. 4 is a schematic block diagram showing the elements used in a method for driving a word line according to an embodiment of the present invention.

Referring to FIG. 4, there is shown a block diagram illustrating a method for driving a word line according to the present invention. In the configuration shown, if row address strobe signal "RAS" supplied externally from a chip changes to an active signal level, the chip is advanced to an active cycle. At the same time, if address information is input, a row address input buffer RAI 100A is enabled and the decoded address signal of the row address input buffer "RAI" 100A is input to a predecoder 100B. Then, the output signal of the predecoder 100B is input to the address information of a øXE generation circuit 100C, a normal word line decoder 100E and a spare word line decoder 100G, respectively. Further, the output signal of the øXE generation circuit 100C is received by a øX generation circuit 100D. Here, the output signal of the øX generation circuit 100D is supplied as source power to the normal word line decoder 100E and the spare word line decoder 100G, respectively. As disclosed above, the method of the present invention enables data access speed to be greatly increased since the normal word line decoder 100E and the spare word line decoder 100G are operated individually from the øXE generation circuit 100 C, and since the signal øXEX is removed so that the enabling time of the signal øX can be reduced.

Figure 5:
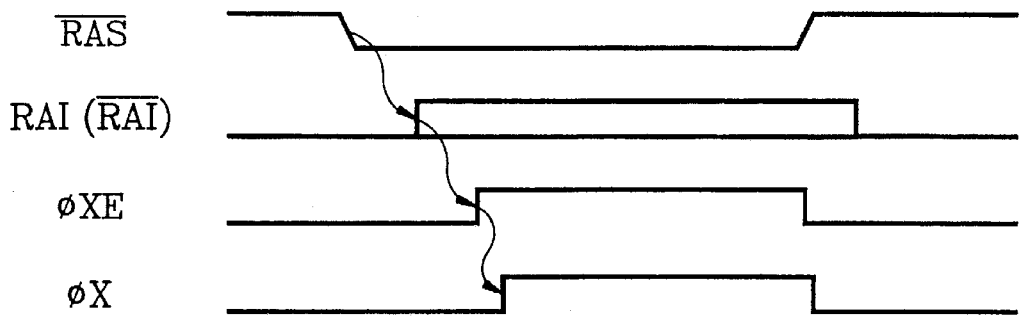
FIG. 5 is a timing chart for the word line driving method of FIG. 4.

FIG. 5 is an operation timing chart of FIG. 4. As shown, the signal øX provided by the øX generation circuit 100D and utilized as source power for the word line signal is enabled after the signal øXE.

Figure 6A:
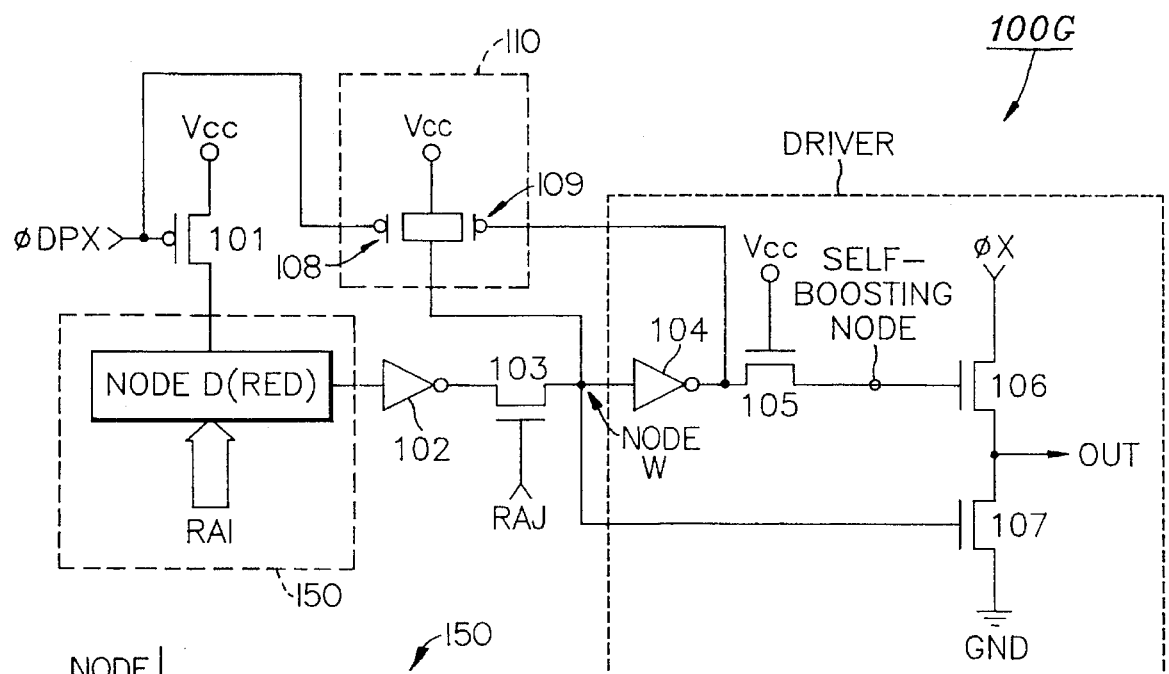
FIG. 6A is a detailed circuit diagram showing the spare word line decoder of FIG. 4.

Referring to FIG. 6A, illustrating the spare word line decoder 100G of FIG. 4, during a precharging cycle, a row decoder precharge signal øDPX disables node D and a driver. If the normal word line is selected, node D changes to the "low" state by operation of the row address input buffer RAI, and the output of an inverter 102 is "high". During this time, although one of the outputs of the spare word line decoder is selected by a row address RAI, the driver maintains a disabling state through operation of the inverter 102. In the case the spare word line of a redundancy array is selected, the node D maintains the "high" state by cutting off the input signal varying the state of the node D (RED). Therefore, the output of the inverter 102 goes "low", and if a transistor 103 is turned on by the row address RAI, the output of an inverter 104 becomes "high", so that a self-boosting node is precharged to a Vcc-Vt. Here, if signal øX is input, the output of the inverter 104 catches up with the signal level øXE so that the spare word line is enabled.

A precharge and holding circuit 110 as shown in FIG. 6A includes two PMOS transistors 108 and 109 connected in parallel between the power supply voltage Vcc and a node W. The transistor 108 receives the signal øDPX of the logic "low" state during a precharge cycle to precharge the voltage at node W to the voltage Vcc. The logic "high" state of the Vcc at node W is inverted by the inverter 104 and turns on the transistor 109, to thereby hold the voltage at node W at the logic "high" state. Thus, transistor 106 is turned off and transistor 107 is turned on, generating a logic "low" state at the output terminal thereof.

Figure 6D:
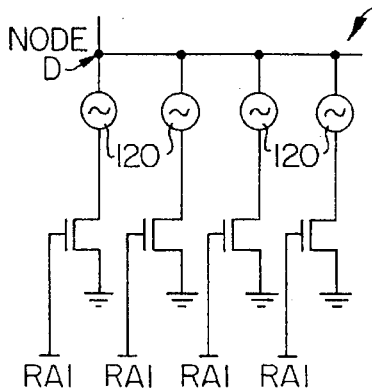
FIG. 6D is a detailed circuit diagram showing NODE D and the input row address RAI of FIG. 6A.

FIG. 6D is a detailed circuit diagram showing NODE D and the input row address "RAI" of FIG. 6A. As shown, this portion of the circuit comprises a plurality of transistors in parallel with one another between RAI and NODE D. The redundant enable driving signal (or "RED" signal) is generated by a fuse box 150 programmed to generate a predetermined logic state upon receipt of programmed address inputs. This programming is done by selectively cutting off predetermined fuses 120.

Figure 6B:
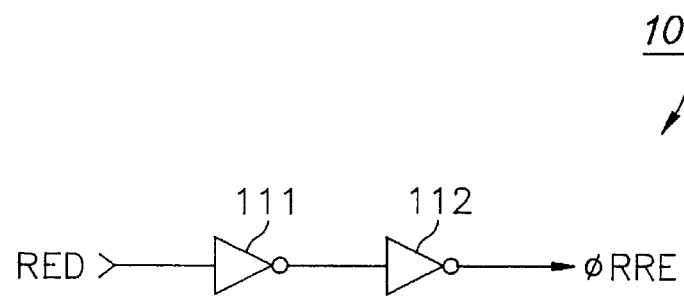
FIG. 6B is a detailed diagram showing the redundancy enabling circuit of FIG. 4.

The øRRE generation circuit 100F is shown in FIG. 6B and functions as the redundancy enabling circuit of FIG. 4. The circuit 100F is constructed to enable only the signal øRRE from the input of the RED signal. That is, if the RED signal is input, only signal øRRE will be enabled by inverters 111 and 112. In the construction of FIG. 6B, the øRRE generation circuit is not necessary for the input of the signal associated with a word line boosting, so that the signal øRRE is capable of being enabled at high speed. In the instance in which the number of the RED information is more than two, the same operation and effect as the above are achieved by using a NOR gate as the inverter 111.

Figure 6C:
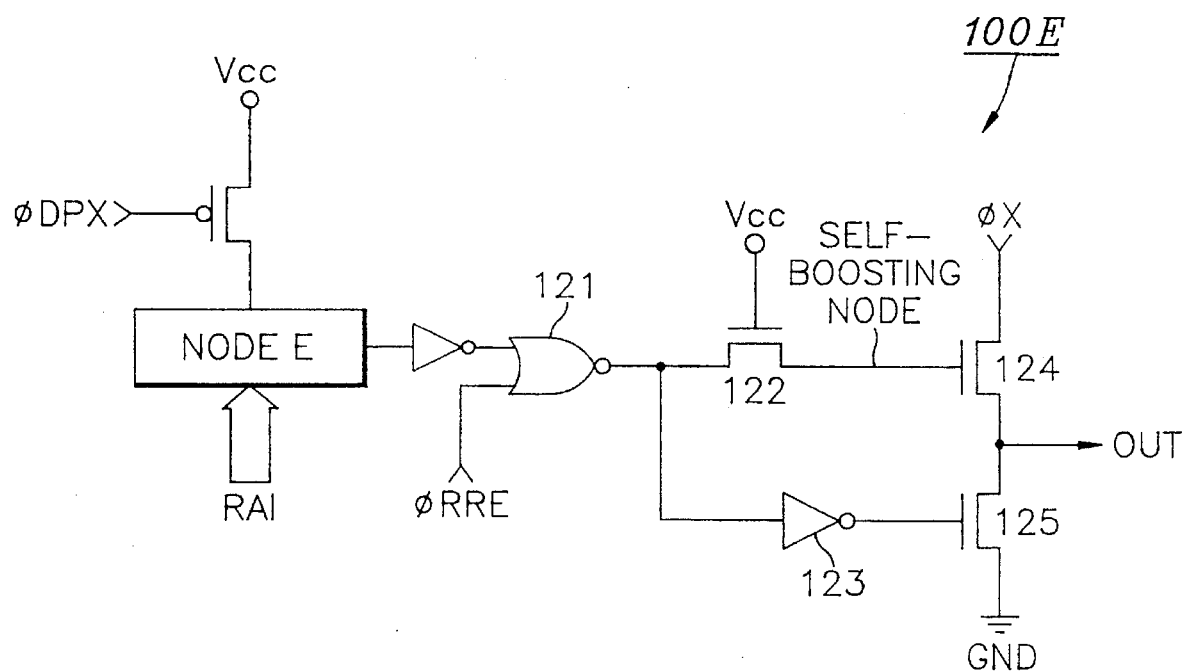
FIG. 6C is a detailed circuit diagram showing the normal word line decoder of FIG. 4.

Referring to FIG. 6C illustrating the normal word line decoder 100E of FIG. 4, when node E is selected, node E maintains the "high" state. Here, non-selected nodes go to the "low" state to disable the driver. If an arbitrary word line is selected in normal cell array blocks of a predetermined selected normal word line decoder, the signal øRRE changes to the "low" state, so that the self-boosting node is precharged as much as Vcc-Vt and the output of the normal word line decoder 100E is enabled according to the input of the signal øX.

As disclosed in the above embodiments of the present invention, the method for driving a word line according to the preferred embodiments of FIG. 4 is employed by directly supplying a word line boosting signal to the normal word line decoder or the spare word line decoder without a circuit (i.e., a øXEX generation circuit) that delays the word line boosting signal, so that the selection of a word line is achieved at a higher speed. In addition, the construction of the circuit for selecting the word line is simple.

The inventive øRRE generation circuit 100F is driven independently of the signal øXE as shown in FIGS. 4 and 6B. This is in contrast to the conventional øRRE generation circuit 50G in FIG. 1, which operates in response to the signal øXE. Since, the normal word line decoder 100E and spare word line decoder 100G of the present invention are operated independently of the signal øXE output from 100C, high data access speed of the device is achieved, and it is not necessary to delay the signal øXE. The øRRE generation circuit 100F of FIG. 6B does not receive the signal øXE. In instance in which the number of data bits of the signal øRED is more than two, the inverter 111 should be replaced with a NOR gate for receiving the multiple input bits of the signal øRED.

FIG. 4 is a functional block diagram employed in view of the spirit of the present invention, and FIGS. 6A, 6B and 6C are the best preferred embodiments on the basis of the block diagram of FIG. 4. In consideration of their logic constructions, however, it is possible for a variety of other embodiments to be employed.

As may be apparent from the aforementioned description, a semiconductor memory device having a data access operation adequately corresponding to the processing speed of a system can be provided by executing the semiconductor memory device for driving a word line at high speed. Further, there are advantages in that the construction of the circuit is quite simple, and in that the conventional inconvenience that the application time of a word line boosting signal must be timely set is also removed.

While there is shown and described the preferred embodiment of the invention, it will be understood by those skilled in the art that foregoing and other changes in form and details may be made without departing from the spirit and scope of the present invention.

What is claimed is:

1. A semiconductor memory device comprising:

a row address input buffer for receiving a row address strobe signal and for generating a row address input buffer signal;

a predecoder for receiving said row address input buffer signal from said row address input buffer and for predecoding a row address therefrom to obtain a predecoder signal;

a word line signal generating means for generating a word line boosting signal from said predecoder signal;

power source supply means for receiving the word line boosting signal from said word line signal generating means and for generating source power therefrom;

a spare word line decoder for receiving said row address, said predecoder signal and said source power, said spare word line decoder generating a spare word line decoder output signal when said row address corresponds to a predetermined address stored in said spare word line decoder, said spare word line decoder also generating a redundancy signal when said spare word line decoder output signal is generated;

a redundancy delay circuit for delaying said redundancy signal a predetermined period of time; said redundancy circuit receiving only said redundancy signal and outputting a delayed redundancy signal; and a normal word line decoder which receives said predecoder signal, said source power, said delayed redundancy signals and said row address, said normal word line decoder being operable to select a normal word line when said row address corresponds to a predetermined address stored in said normal word line decoder and said delayed redundancy signal indicates that said spare word line decoder output signal was not generated by said spare word line decoder.

* * * * *